United States Patent
Wang et al.

(10) Patent No.: US 12,464,910 B2
(45) Date of Patent: Nov. 4, 2025

(54) DISPLAY SUBSTRATE AND DISPLAY DEVICE

(71) Applicant: BOE Technology Group Co., Ltd., Beijing (CN)

(72) Inventors: Guoying Wang, Beijing (CN); Yicheng Lin, Beijing (CN); Ying Han, Beijing (CN); Mingi Chu, Beijing (CN); Pan Xu, Beijing (CN); Xing Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 684 days.

(21) Appl. No.: 17/789,153

(22) PCT Filed: Aug. 12, 2021

(86) PCT No.: PCT/CN2021/112233
§ 371 (c)(1),
(2) Date: Jun. 24, 2022

(87) PCT Pub. No.: WO2022/052736
PCT Pub. Date: Mar. 17, 2022

(65) Prior Publication Data
US 2022/0392993 A1    Dec. 8, 2022

(30) Foreign Application Priority Data
Sep. 11, 2020   (CN) .......................... 202010953477.7

(51) Int. Cl.
*H10K 59/131*   (2023.01)
*H10K 59/12*    (2023.01)
(Continued)

(52) U.S. Cl.
CPC .......... *H10K 59/131* (2023.02); *H10K 59/12* (2023.02); *H10K 59/126* (2023.02); *H10K 59/80522* (2023.02)

(58) Field of Classification Search
CPC .... H10K 59/131; H10K 59/126; H10K 59/12; H10K 59/80522; G09F 9/30
(Continued)

(56) References Cited

U.S. PATENT DOCUMENTS

2018/0314120 A1    11/2018   Peng
2020/0144351 A1    5/2020    Liu et al.
(Continued)

FOREIGN PATENT DOCUMENTS

CN    106896609 A    6/2017
CN    108321182 A    7/2018
(Continued)

OTHER PUBLICATIONS

PCT/CN2021/112233 international search report and written opinion.

*Primary Examiner* — Theresa T Doan
(74) *Attorney, Agent, or Firm* — IPro, PLLC

(57) ABSTRACT

Provided in the present disclosure are a display substrate and a display device. In the display substrate, at least a portion of a cathode is located in a display region; at least one driver chip is located in a non-display region; a first power supply signal line pattern is located in the non-display region and arranged on at least one side of the display region. The first power supply signal line pattern comprises a first transmission portion and a first wire inlet portion electrically connected to the first transmission portion. The first transmission portion extends in a first direction, and is electrically connected to the cathode. The first wire inlet portion extends in a second direction intersecting with the first direction. The (Continued)

first wire inlet portion is electrically connected to the at least one driver chip.

18 Claims, 2 Drawing Sheets

(51) Int. Cl.
*H10K 59/126* (2023.01)
*H10K 59/80* (2023.01)

(58) Field of Classification Search
USPC .......................................................... 257/40
See application file for complete search history.

(56) References Cited

U.S. PATENT DOCUMENTS

| 2021/0335983 | A1 | 10/2021 | Feng et al. |
| 2022/0392993 | A1 | 12/2022 | Wang et al. |

FOREIGN PATENT DOCUMENTS

| CN | 110190103 | * | 5/2019 |
| CN | 110190103 | A | 8/2019 |
| CN | 110794610 | A | 2/2020 |
| CN | 111916488 | A | 11/2020 |
| CN | 212257402 | U | 12/2020 |

* cited by examiner

DISPLAY SUBSTRATE AND DISPLAY DEVICE

CROSS-REFERENCE TO RELATED APPLICATIONS

The present application is the U.S. national phase of PCT Application No. PCT/CN2021/112233 filed on Aug. 12, 2021, which claims priority to Chinese Patent Application No. 202010953477.7 filed in China on Sep. 11, 2020, the disclosure of which is hereby incorporated by reference in its entirety.

TECHNICAL FIELD

The present disclosure relates to the technical field of display, and in particular, to a display substrate and a display device.

BACKGROUND

At present, large size and ultra-high-definition have become two major directions for market consumption upgrading of display products, and the frame of mainstream display products in current market is relatively large. If used as a tiled screen display, the frame will affect the display effect. If the display screen frame becomes smaller, with respect to user experience, a high screen-to-body ratio is provided which can greatly improve visual experiences for the user and the aesthetic degree of the whole machine; with respect to the seam issue between multiple screens, the width of a black edge of the seam can be reduced, which is more conducive to improve the commercial value of the product. Therefore, how to reduce the frame width of the display product becomes an urgent issue to be addressed.

SUMMARY

The present disclosure is to provide a display substrate and a display device.

In order to achieve this, the present disclosure provides the following technical solutions.

In a first aspect of the present disclosure, a display substrate is provided, including: a display area and a non-display area surrounding the display area; the display substrate further including a cathode, a first power signal line pattern and at least one driver chip;

at least a portion of the cathode is located in the display area;

the at least one driver chip is located in the non-display area; and the first power signal line pattern is located in the non-display area and is located on at least one side of the display area, and the first power signal line pattern includes a first transmission portion and a first incoming line portion electrically connected to the first transmission portion; and the first transmission portion extends in a first direction, the first transmission portion is electrically connected to the cathode, the first incoming line portion extends in a second direction intersecting with the first direction, and the first incoming line portion is electrically connected to the at least one driver chip.

Optionally, the at least one driver chip is located on a first side of the display area, and the first power signal line pattern is located between the display area and the at least one driver chip; and the first power signal line pattern is configured to transmit a negative power signal.

Optionally, the display substrate further includes a second power signal line pattern, and the second power signal line pattern includes a first sub-pattern and a plurality of second sub-patterns;

the first sub-pattern includes a second transmission portion, and two second incoming line portions electrically connected to the second transmission portion, the two second incoming line portions are electrically connected to the at least one driver chip, and the first power signal line pattern is located between the two second incoming line portions;

the plurality of second sub-patterns is located in the display area, and the plurality of second sub-patterns is electrically connected to the second transmission portion; and the second power signal line pattern is configured to transmit a positive power signal.

Optionally, the display area includes a plurality of data lines and a plurality of sub-pixels, the plurality of data lines is electrically connected to the plurality of sub-pixels; the non-display area includes a fan-out region and a driver chip bonding region, wherein the fan-out region is located between the display area and the driver chip bonding region;

the fan-out region includes a plurality of fan-out lines, at least one of the fan-out lines is formed as an integral structure, and first ends of the plurality of fan-out lines are connected to the plurality of data lines; and the at least one driver chip is arranged in the driver chip bonding region, and second ends of the plurality of fan-out lines are connected to first pins included in the at least one driver chip.

Optionally, the plurality of fan-out lines is arranged in the same layer and made of the same material.

Optionally, the plurality of fan-out lines include a plurality of first fan-out lines and a plurality of second fan-out lines, the plurality of first fan-out lines is arranged in the same layer and made of the same material, and the plurality of second fan-out lines is arranged in the same layer and made of the same material; the plurality of first fan-out lines and the plurality of second fan-out lines are arranged in different layers; and orthographic projections of the plurality of first fan-out lines onto a base of the display substrate and orthographic projections of the plurality of second fan-out lines onto the base are arranged alternately.

Optionally, the fan-out region and the driver chip bonding region are both located on a first side of the display area; and the non-display area is provided with an electrostatic discharge circuit, and the electrostatic discharge circuit is located on a second side of the display area the first side is opposite to the second side.

Optionally, the first power signal line pattern and the second power signal line pattern are arranged in the same layer, and the first power signal line pattern is insulated from the second power signal line pattern.

Optionally, the display substrate further includes an insulating layer, and in a direction perpendicular to the base of the display substrate, the first power signal line pattern and the second power signal line pattern are located on the same side of the insulating layer, and the plurality of fan-out lines are located on the other side of the insulating layer; and an orthographic projection of the first power signal line pattern onto the base of the display substrate at least partially overlaps with orthographic projections of the plurality of fan-out lines onto the base; and/or an orthographic projection of the second power signal line pattern onto the base at least partially overlaps the orthographic projections of the plurality of fan-out lines onto the base.

Optionally, an orthographic projection of the first power signal line pattern onto the base of the display substrate does not overlap with orthographic projections of the plurality of fan-out lines on the base.

Optionally, the display substrate further includes a sub-pixel driver circuit, the sub-pixel driver circuit includes:

an active layer, a first gate metal layer and a first source-drain metal layer which are stacked in the sequence listed in a direction away from the base of the display substrate; and the plurality of fan-out lines and the first source-drain metal layer are arranged in the same layer and made of the same material, and the first power signal line pattern and the second power signal line pattern are both arranged in the same layer and made of the same material as the first gate metal layer.

Optionally, the display substrate further includes: a sub-pixel driver circuit, the sub-pixel driver circuit includes:

an active layer, a first gate metal layer and a first source-drain metal layer which are stacked in the sequence listed in a direction away from the base of the display substrate; and the plurality of fan-out lines and the first gate metal layer are arranged in the same layer and made of the same material, and the first power signal line pattern and the second power signal line pattern are both arranged in the same layer and made of the same material as the first source-drain metal layer.

Optionally, the plurality of fan-out lines is formed as at least one fan-out line set which is in one-to-one correspondence with the at least one driver chip, a fan-out line set in the at least one fan-out line set is of a fan shape, and second ends of fan-out lines included in the fan-out line set are connected to first pins included in a corresponding driver chip in one-to-one correspondence.

One the basis of the technical solution of the display substrate, in a second aspect of the present disclosure, a display device is provided, including the display substrate described above.

BRIEF DESCRIPTION OF THE DRAWINGS

The accompanying drawings illustrated here are to provide a further understanding of the present disclosure and constitute a portion of the present disclosure, exemplary embodiment(s) of the present disclosure and description thereof are to explain the disclosure and do not constitute an undue limitation for the disclosure. In the drawings.

DETAILED DESCRIPTION

In order to further explain the display substrate and the display device provided by the embodiments of the present disclosure, a detailed description will be given below with reference to the accompanying drawings.

Figure 1:
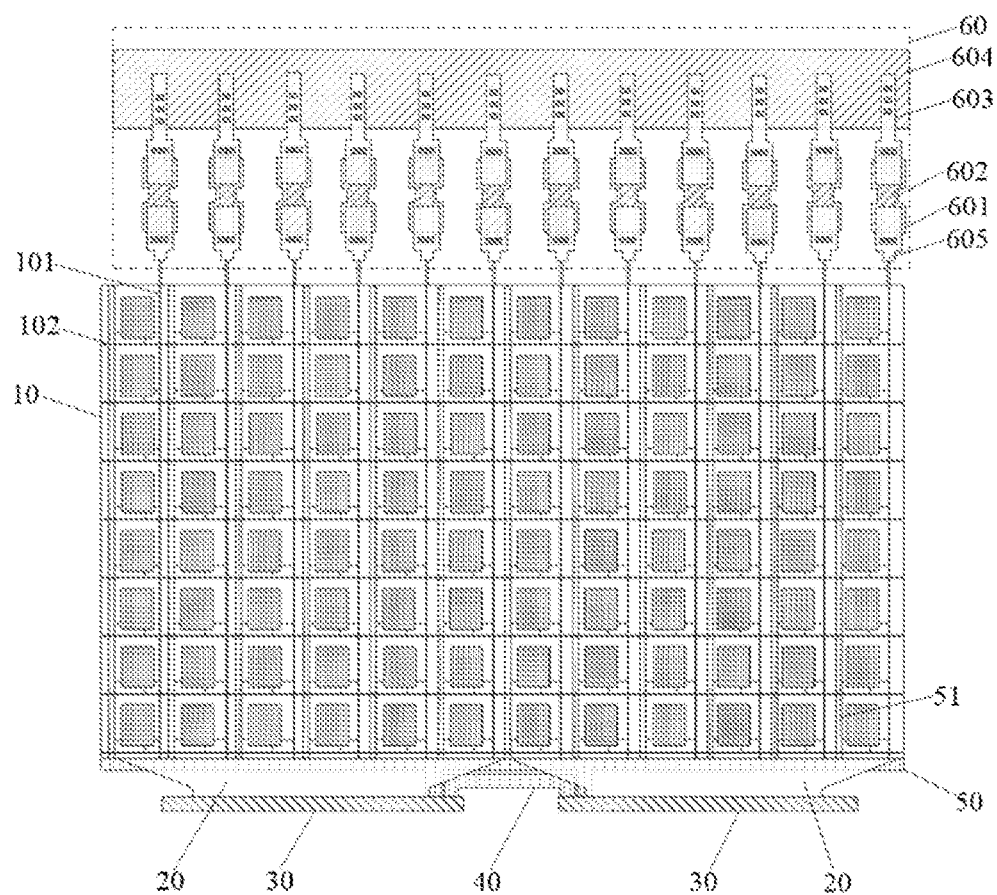
FIG. 1 is a schematic diagram showing a layout of a display substrate according to an embodiment of the present disclosure.
Figure 2:
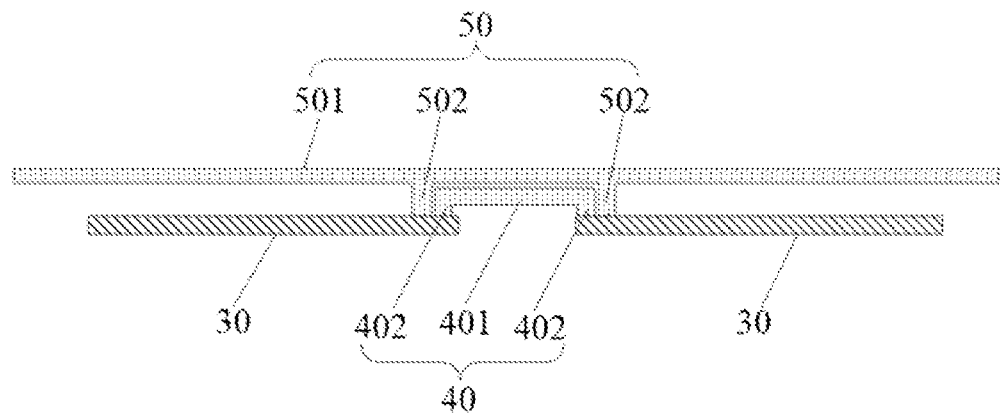
FIG. 2 is a schematic diagram showing a structure of a power signal line according to an embodiment of the present disclosure.

Referring to FIGS. 1 and 2, an embodiment of the present disclosure provides a display substrate, including a display area 10 and a non-display area surrounding the display area 10; the display substrate further includes a cathode, a first power signal line pattern 40 and at least one driver chip 30;

at least a portion of the cathode is located in the display area 10;

the at least one driver chip 30 is located in the non-display area; and the first power signal line pattern 40 is located in the non-display area and is located at one or more sides of the display area 10, and the first power signal line pattern 40 includes a first transmission portion 401 and a first incoming line portion 402 electrically connected to the first transmission portion 401; the first transmission portion 401 extends in a first direction, the first transmission portion 401 is electrically connected to the cathode, the first incoming line portion 402 extends in a second direction intersecting with the first direction, and the first incoming line portion 402 is electrically connected to the at least one driver chip 30.

Specifically, the specific quantity of driver chips 30 included in the display substrate may be set according to actual needs, and illustratively, the display substrate includes two driver chips 30. The driver chip 30 may be bonded in a bonding region in the non-display area, the bonding region is located at a first side of the display area.

Taking the display substrate including two driver chips as an example, the first power signal line pattern 40 includes the first transmission portion 401 and two first incoming line portions 402, and the two first incoming line portions 402 are electrically connected to the two driver chips in one-to-one correspondence.

Illustratively, the first power signal line pattern 40 includes a negative power signal line pattern VSS, and the first power signal line pattern 40 may transmit a first power signal provided by the at least one driver chip 30 to the cathode.

It is to be noted that there may be various specific connection manners between the cathode and the first transmission portion 401, and illustratively, an orthographic projection of the cathode onto the base of the display substrate overlaps with an orthographic projection of the first transmission portion 401 onto the base at an overlapping region at which the cathode and the first transmission portion 401 are connected through a via hole. Alternatively, the display substrate may further include an intermediate connecting portion connected to both the cathode and the first transmission portion.

In the display substrate provided by embodiments of the present disclosure, the first power signal line pattern 40, as a whole, is arranged on the at least one side of the display area 10, so that the first power signal line pattern 40 occupies only the space of the at least one side of the display area 10, the first power signal line pattern 40 does not occupy too much space of the non-display area, thereby effectively reducing the frame width of the display substrate. Therefore, the technical solution provided by the present disclosure can satisfy requirements of a large-size display with an ultra-narrow frame and a display with a narrow frame used in multiple tiled display panels.

In some embodiments, the at least one driver chip 30 is located at a first side of the display area 10, and the first power signal line pattern 40 is located between the display area 10 and the at least one driver chip 30; and the first power signal line pattern 40 is configured to transmit a negative power signal.

In the display substrate provided by the above-described embodiment, the at least one driver chip 30 is arranged to be located at the first side of the display area 10, and the first power signal line pattern 40 is arranged to be located between the display area 10 and the at least one driver chip 30, so that the first power signal line pattern 40 and the at least one driver chip 30 occupy only the space of the first side of the display substrate, the first power signal line pattern 40 does not occupy spaces of a third side and a fourth side of the display area 10 adjacent to the first side, thereby effectively reducing the frame width of the display substrate at the third side and the fourth side of the display area 10.

As shown in FIGS. 1 and 2, in some embodiments, the display substrate further includes a second power signal line pattern, and the second power signal line pattern includes a first sub-pattern 50 and a plurality of second sub-patterns 51;
- the first sub-pattern 50 includes a second transmission portion 501, and two second incoming line portions 502 electrically connected to the second transmission portion 501, the two second incoming line portions 502 are electrically connected to the at least one driver chip 30, and the first power signal line pattern 40 is located between the two second incoming line portions 502; and
- the plurality of second sub-patterns 51 is located in the display area 10, and the plurality of second sub-patterns 51 is electrically connected to the second transmission portion 501.

Illustratively, the second power signal line pattern includes a positive power signal line pattern VDD, configured to transmit a positive power signal.

Illustratively, the second transmission portion 501 and the two second incoming line portions 502 are formed as an integral structure.

Illustratively, in a case where the display substrate includes two driver chips 30, the two second incoming line portions 502 are electrically connected to the two driver chips 30 in one-to-one correspondence.

At least a portion of the second sub-pattern 51 extends in a second direction. Illustratively, the plurality of second sub-patterns 51 and the second transmission portion 501 are formed as an integral structure. Illustratively, each of the second sub-patterns 51 may provide a second power signal to sub-pixels included in a corresponding column of pixel units, each pixel unit includes at least three sub-pixels selected from a red sub-pixel, a green sub-pixel, a blue sub-pixel, and a white sub-pixel.

In the display substrate provided in the above-described embodiment, the first sub-pattern 50 includes the second transmission portion 501 and the two second incoming line portions 502 electrically connected to the second transmission portion 501, and the first power signal line pattern 40 is located between the two second incoming line portions 502, so that the first power signal line pattern 40 and the second power signal line pattern are driven on the same side, and the first power signal line pattern 40 and the second power signal line pattern both occupy a relatively small space, thereby reducing the frame width of the display area 10 at of the first side from 10 mm in related art to 5 mm.

Referring to FIG. 1, in some embodiments, the display area 10 includes a plurality of data lines and a plurality of sub-pixels, and the plurality of data lines and the plurality of sub-pixels are electrically connected. The non-display area includes a fan-out region 20 and a driver chip 30 bonding region, where the fan-out region 20 is located between the display area 10 and the driver chip bonding region; the fan-out region 20 includes a plurality of fan-out lines, at least one of the fan-out lines is formed as an integral structure, and first ends of the plurality of fan-out lines are connected to the plurality of data lines 101; and the at least one driver chip 30 is arranged in the driver chip 30 bonding region, and second ends of the plurality of fan-out lines are connected to first pins included in the at least one driver chip 30.

Specifically, the display substrate includes the display area 10 and the non-display area enclosing the display area 10. Illustratively, the plurality of fan-out lines in the fan-out region 20 include data line leads, and the first pins included in the at least one driver chip 30 are configured for providing data signals. Illustratively, the first ends of the plurality of fan-out lines are electrically connected to the plurality of data lines 101 in one-to-one correspondence, and the second ends of the plurality of fan-out lines are electrically connected to the first pins included in the at least one driver chip 30 in one-to-one correspondence.

Illustratively, the plurality of sub-pixels are distributed in an array, and the plurality of sub-pixels may be divided into a plurality of rows of sub-pixels and a plurality of columns of sub-pixels, each row of sub-pixels includes a plurality of sub-pixels arranged sequentially along a first direction, and each column of sub-pixels includes a plurality of sub-pixels arranged sequentially along a second direction.

Illustratively, at least a portion of the data line 101 extend in the first direction, the plurality of data lines 101 and the plurality of columns of sub-pixels are in one-to-one correspondence, and each data line 101 is electrically connected to each sub-pixel in a corresponding column of sub-pixels.

The display substrate further includes a plurality of gate lines 102, at least a portion of the gate line 102 extend in the second direction, the plurality of gate lines 102 and the plurality of rows of sub-pixels are in one-to-one correspondence, and each gate line 102 is electrically connected to each sub-pixel in a corresponding row of sub-pixels for controlling writing of a data signal to the corresponding row of sub-pixels.

The quantity of the driver chips 30 bonded to the driver chip 30 bonding region may be set according to actual needs. Illustratively, the driver chip 30 includes a source driver chip, configured for outputting data signals to the fan-out lines through the first pins.

The fan-out region 20 is located between the display area 10 and the bonding region for the driver chip 30, and the fan-out lines in the fan-out region 20 are connected to corresponding signal lines and corresponding first pins, respectively, for transmitting data signals provided by the driver chip 30 to the data lines 101.

Illustratively, all fan-out lines in the fan-out region are formed as an integral structure.

Illustratively, some fan-out lines from the fan out lines included in the fan-out region are formed as an integral structure.

It is to be noted that in the layout of the fan-out lines, generally, each fan-out line is arranged to include two segments of patterns arranged in different layers, and the two segments of patterns are connected through a via hole. This arrangement allows both the two segments of patterns included in each fan-out line to have a relatively wide width, so as to ensure the connecting performance when the two patterns are connected through the via hole.

In the display substrate provided by the embodiments of the present disclosure, at least one of the fan-out lines is formed as an integral structure, so that each fan-out line in the at least one of the fan-out lines can be formed by a single patterning process. Therefore, for the fan-out lines in the present disclosure, there is no need for considering the connecting performance of the two segments of patterns, so that the fan-out lines in the present disclosure can have a narrower line width, and the length of the fan-out line in the direction in which the signal lines extends can be effectively shortened when arranging the plurality of fan-out lines, thereby effectively reducing the width of the fan-out region 20 and thus reducing the frame width of the display substrate at the side where the fan-out region 20 is located.

Therefore, the display substrate provided by the present disclosure satisfies an ultra-narrow frame needed in a large-size display and a narrow-frame display needed in multiple tiled display panels.

In some embodiments, the plurality of fan-out lines is arranged in the same layer and made of the same material.

Illustratively, the plurality of fan-out lines is arranged sequentially along a first direction (namely, an extending direction of the gate line 102), and there is a spacing between adjacent fan-out lines so as to ensure insulation between the adjacent fan-out lines.

By arranging the plurality of fan-out lines the same layer and forming the same using the same material, the plurality of fan-out lines can be formed at the same time in a single patterning process, which is not only advantageous for narrowing the frame, but also can simplify the manufacturing process of the display substrate and save manufacturing costs.

In some embodiments, the plurality of fan-out lines include a plurality of first fan-out lines and a plurality of second fan-out lines, the plurality of first fan-out lines is arranged in the same layer and made of the same material, and the plurality of second fan-out lines is arranged in the same layer and made of the same material; the first fan-out lines and the second fan-out lines are arranged in different layers; and orthographic projections of the plurality of first fan-out lines onto a base of the display substrate alternate with orthographic projections of the plurality of second fan-out lines onto the base.

As shown in FIG. 1, in some embodiments, the plurality of fan-out lines is formed as at least one fan-out line set which is in one-to-one correspondence with the at least one driver chip 30, the fan-out line set is fan-shaped, and second ends of fan-out lines included in the fan-out line set are connected to first pins included in a corresponding driver chip 30 in one-to-one correspondence.

Specifically, in a case where each fan-out line is configured to include a first segment of pattern and a second segment of pattern arranged in different layers, the first segment of pattern in each fan-out line extends in a first direction, and illustratively, the first direction is an extending direction of the data line 101; and the second segment of pattern in each fan-out line extends in a second direction intersecting with the first direction, and second segments of pattern of various fan-out lines may be formed as a fan-shaped structure. The first segment of pattern is for a connection to the data line 101 in the display area 10, and the second segment of pattern is for a connection to a pin of the driver chip 30.

Since the fan-out lines in the present disclosure have a narrower line width, in disposing the fan-out lines in the present disclosure, each fan-out line can be arranged to not include a portion extending in the first direction. That is, the plurality of fan-out lines is only needed to be arranged to form fan-out line sets having a fan shape. In this way, the width of the fan-out region 20 and thus the frame width of the display substrate at the side where the fan-out region 20 is located can be effectively reduced.

As shown in FIG. 1, in some embodiments, the fan-out region 20 and the driver chip 30 bonding region are both located at the first side of the display area; and the non-display area is provided with an electrostatic discharge circuit 60, and the electrostatic discharge circuit 60 is located on a second side, opposite to the first side, of the display area 10.

Specifically, the display substrate further includes an electrostatic discharge circuit 60 (ESD), and the electrostatic discharge circuit 60 is configured for discharging static electricity generated in the display substrate, thereby improving the performance of the display substrate and the yield.

Illustratively, the electrostatic discharge circuit 60 includes electrostatic discharge units corresponding to data lines in one-to-one correspondence, and each electrostatic discharge unit is formed as a structure similar to a thin film transistor. The electrostatic discharge unit specifically includes a first electrode 601 in a floating state, and the first electrode 601 is generally made of the first gate metal layer in the display substrate. The electrostatic discharge unit further includes an active pattern 602, and the active pattern 602 is made of a semiconductor material, and two ends of the active pattern 602 are electrically connected to a first conductive pattern 605 and a second conductive pattern 603, respectively. The first conductive pattern 605 is connected to a corresponding data line 101, the second conductive pattern 603 is connected to a common electrode 604, and an orthographic projection of the first conductive pattern 605 onto the base of the display substrate overlaps with the first electrode 601.

The working principle of the electrostatic discharge unit is illustrated as follows. Charges on the data line 101 are accumulated continuously on the first conductive pattern 605, and a coupling occurs between the first conductive pattern 605 and the first electrode 601 to transmit the accumulated charges to the first electrode 601. With the charges on the first electrode 601 accumulated continuously, the voltage increases continuously to control the first conductive pattern 605 to be connected to the second conductive pattern 603, so as to discharge the accumulated charges on the data line 101 to the common electrode 604.

In the display substrate provided in the above-described embodiment, by arranging the electrostatic discharge circuit 60 at the opposite side of the fan-out region 20 and the driver chip 30 bonding region, the frame width of the display substrate at the side where the fan-out region 20 is located can be effectively reduced.

As shown in FIGS. 1 to 4, in some embodiments, the first power signal line pattern 40 and the second power signal line pattern are arranged in the same layer, and the first power signal line pattern 40 is insulated from the second power signal line pattern;

the display substrate further includes an insulating layer, and in a direction perpendicular to the base of the display substrate, the first power signal line pattern 40 and the second power signal line pattern are located at the same side of the insulating layer, and the plurality of fan-out lines are located at the other side of the insulating layer;

an orthographic projection of the first power signal line pattern 40 onto the base of the display substrate at least partially overlaps with orthographic projections of the fan-out lines onto the base; and/or an orthographic projection of the second power signal line pattern onto the base at least partially overlaps with the orthographic projections of the fan-out lines onto the base.

Specifically, the display substrate further includes the insulating layer, and illustratively, the first power signal line pattern 40 and the second power signal line pattern are located on a side of the insulating layer facing away from the base, and the plurality of fan-out lines is located between the insulating layer and the base. Alternatively, the first power signal line pattern 40 and the second power signal line pattern are located between the insulating layer and the base, and the plurality of fan-out lines are located at a side of the insulating layer facing away from the base.

In the display substrate provided by the above-described embodiments, by arranging both the first power signal line pattern 40 and the second power signal line pattern in a layer different from a layer for the fan-out lines, and arranging the orthographic projection of the first power signal line pattern 40 onto the base of the display substrate to be at least partially overlapped with the orthographic projections of the fan-out lines onto the base; and/or the orthographic projection of the second power signal line pattern onto the base to be at least partially overlapped with orthographic projections of the fan-out lines onto the base, the frame width of the display substrate at the side where the fan-out region 20 is located can be further reduced.

In some embodiments, the orthographic projection of the first power signal line pattern onto the base of the display substrate does not overlap with the orthographic projections of the fan-out lines onto the base.

Figure 3:
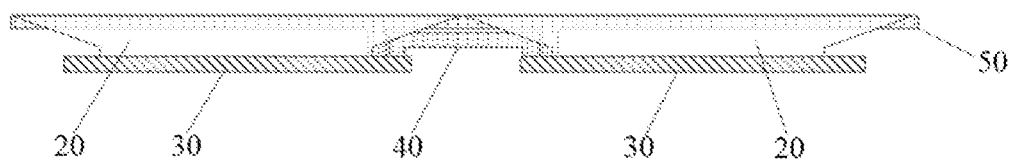
FIG. 3 is a schematic diagram of a first layout of a fan-out region and a power signal line pattern according to an embodiment of the present disclosure.

As shown in FIGS. 1 and 3, in some embodiments, the display substrate further includes a sub-pixel driver circuit, the sub-pixel driver circuit includes an active layer, a first gate metal layer and a first source-drain metal layer which are sequentially arranged in a stack in a direction away from the base of the display substrate. The fan-out lines are arranged in the same layer and made of the same material as the first source-drain metal layer, and the first power signal line pattern 40 and the second power signal line pattern are both arranged in the same layer and made of the same material as the first gate metal layer.

Specifically, the display substrate further includes the sub-pixel driver circuit including a storage capacitor and a plurality of transistors. The sub-pixel driver circuit includes the active layer, the first gate metal layer and the first source-drain metal layer which are arranged sequentially as a stack in a direction away from the base of the display substrate, and the active layer is for forming channels of the transistors, the first gate metal layer is for forming gates of the transistors, and the first source-drain metal layer is for forming some conductive connections.

By arranging the fan-out lines and the first source-drain metal layer in the same layer and forming the same by the same material, the fan-out lines and the first source-drain metal layer can be formed simultaneously in the same single patterning process, thereby simplifying the manufacturing process of the display substrate and reducing the manufacturing cost of the display substrate.

By arranging the first power signal line pattern 40 and the second power signal line pattern in the same layer and forming the same by the same material as the first gate metal layer, the first power signal line pattern 40, the second power signal line pattern and the first gate metal layer can be formed simultaneously in the same single patterning process, thereby simplifying the manufacturing procedure of the display substrate and reducing the manufacturing cost of the display substrate.

Figure 4:
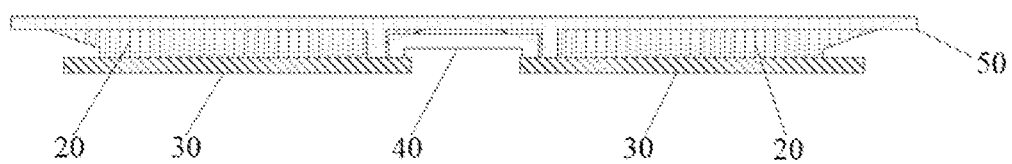
FIG. 4 is a schematic diagram of a second layout of a fan-out region and a power signal line pattern according to an embodiment of the present disclosure.

As shown in FIG. 4, in some embodiments, the display substrate further includes a sub-pixel driver circuit, the sub-pixel driver circuit includes an active layer, a first gate metal layer and a first source-drain metal layer which are sequentially arranged in a stack in a direction away from the base of the display substrate. The fan-out lines are arranged in the same layer and made of the same material as the first gate metal layer, and the first power signal line pattern 40 and the second power signal line pattern are both arranged in the same layer and made of the same material as the first source-drain metal layer.

By arranging the fan-out lines and the first gate metal layer are in the same layer and forming the same by the same material, the fan-out lines and the first gate metal layer can be formed simultaneously in the same single patterning process, thereby simplifying the manufacturing process of the display substrate and reducing the manufacturing cost of the display substrate.

By arranging the first power signal line pattern 40 and the second power signal line pattern in the same layer and forming the same by the same material as the first source-drain metal layer, both the first power signal line pattern 40 and the second power signal line pattern can be formed simultaneously in the same single patterning process with the first source-drain metal layer, thereby simplifying the manufacturing procedure of the display substrate and reducing the manufacturing cost of the display substrate.

It should be noted that the technical solutions provided in the above-described embodiments are applicable to the manufacturing process of bottom-emitting active-matrix organic light-emitting diode (AM-OLED) display panels based on transistors with different structures (TFT), such as device structures including any one of a top gate structure (Top Gate), a back channel etching (BCE) and etch-stop layer (ESL).

The technical solutions provided in the above-described embodiments are applicable to a TFT with the active layer formed by any of various oxides, silicon materials and organic materials, and the material of the active layer may include various materials such as a-IGZO, ZnON, IZTO, a-Si, p-Si, hexathiophene, polythiophene, and the like. Namely, the technical solutions is applicable to a bottom emission display backplate manufactured based on any of an oxide technology, a silicon technology and an organic technology.

The technical solutions provided in the above-described embodiments are applicable to a planarization material in a display substrate, including, but not limited to, the planarization material such as organics, silicon-glass bonding structure (SOG) and benzocyclobutene resin (BCB).

The electrode material used in the display substrate provided in the above-described embodiments includes, but is not limited to, a transparent conductive oxide, such as aluminium-doped zinc oxide (AZO), indium zinc oxide (IZO), and a relatively thin metal material, such as composite materials of Mg/Ag, Ca/Ag, Sm/Ag, Al/Ag, Ba/Ag, etc.

In the display substrate provided in the above embodiments, the organic light-emitting material layer may be deposited by evaporation or printing.

An embodiment of the present disclosure further provides a display device, including the display substrate described above.

In the display substrate provided by the embodiments of the present disclosure, the first power signal line pattern is integrally arranged on at least one side of the display area, the first power signal line pattern occupies only the space of the at least one side of the display area, such that the first power signal line pattern does not occupy too much space of the non-display area. In this manner, the frame width of the display substrate can be effectively reduced. Therefore, the display substrate provided by the above-described embodiment satisfies the requirements of both a large-size display with an ultra-narrow frame and multiple tiled display panels with a narrow frame.

Therefore, the display device provided by this embodiment also has the above-described advantageous effects when including the above-described display substrate, and the description thereof will not be repeated here.

It is to be noted that the display device may be a television, a display, a digital photo frame, a mobile phone, a tablet computer, or any product or component with a display function.

In some embodiments, the display device includes a top emission display device or a bottom emission display device.

In manufacturing of the display substrate according to the above embodiment, the display substrate includes: a display area and a non-display area surrounding the display area; the manufacturing method specifically includes:

preparing a cathode, where at least a portion of the cathode is located in the display area;

bonding at least one driver chip, where the at least one driver chip is located in the non-display area; and preparing a first power signal line pattern; where the first power signal line pattern is located on at least one side of the display area, and the first power signal line pattern includes a first transmission portion and a first incoming line portion electrically connected to the first transmission portion; and the first transmission portion extends in a first direction, the first transmission portion is electrically connected to the cathode, the first incoming line portion extends in a second direction intersecting with the first direction, and the first incoming line portion is electrically connected to the at least one driver chip.

In the display substrate provided by the above-described embodiments, the display area includes a plurality of data lines and a plurality of sub-pixels, and the plurality of data lines and the plurality of sub-pixels are electrically connected; the non-display area includes a fan-out region 20 and a bonding region for the driver chip 30, where the fan-out region 20 is located between the display area 10 and the driver chip bonding region; and the manufacturing method includes:

preparing a plurality of fan-out lines in the fan-out region, where at least one of the fan-out lines is formed as an integral structure, and first ends of the fan-out lines are connected to the data lines; and arranging the at least one driver chip in the driver chip bonding region, and second ends of the fan-out lines are connected to first pins included in the at least one driver chip.

In the display substrate manufactured by the manufacturing method described above, each of the fan-out lines can be formed as an integral structure in a single patterning process. Therefore, in the present disclosure, there is no need to consider the connecting performance of two segments of patterns in the fan-out line, so that the fan-out lines in the present disclosure can have a narrower line width. In this way, when arranging the fan-out lines in the present disclosure, the length of the fan-out lines in a direction in which the signal lines extending can be effectively shortened, thereby effectively reducing the width of the fan-out region 20 and reducing the frame width of the display substrate at the side where the fan-out region 20 is located.

Therefore, the display substrate manufactured by the manufacturing method satisfies the requirements of both a large-size display with an ultra-narrow frame and multiple tiled display panels each of which is a narrow-frame display.

In some embodiments, the display substrate further includes a sub-pixel driver circuit, and the manufacturing method further includes: preparing an active layer in the sub-pixel driver circuit;

forming, in a single patterning process, a first power signal line pattern 40, a second power signal line pattern and a first gate metal layer in the sub-pixel driver circuit simultaneously formed on a side of the active layer facing away from the base of the display substrate; and forming, in a single patterning process, a plurality of fan-out lines and a first source-drain metal layer in the sub-pixel driver circuit simultaneously on a side of the first gate metal layer facing away from the base.

In the above-mentioned manufacturing method, the first power signal line pattern 40, the second power signal line pattern and the first gate metal layer in the sub-pixel driver circuit are simultaneously formed by a single patterning process, and the plurality of fan-out lines and the first source-drain metal layer in the sub-pixel driver circuit are simultaneously formed by a single patterning process, the manufacturing procedure of the display substrate can be simplified and the manufacturing cost of the display substrate can be reduced.

In some embodiments, the display substrate further includes a sub-pixel driver circuit, and the manufacturing method further includes: preparing an active layer in the sub-pixel driver circuit;

forming, in a single patterning process, a plurality of fan-out lines and a first gate metal layer in the sub-pixel driver circuit are simultaneously on a side of the active layer facing away from the base of the display substrate; and forming, in a single patterning process, a first power signal line pattern 40, a second power signal line pattern, and a first source-drain metal layer in the sub-pixel driver circuit simultaneously on a side of the first gate metal layer facing away from the bases.

In the above-mentioned manufacturing method, the plurality of fan-out lines and the first gate metal layer in the sub-pixel driver circuit are simultaneously formed through a single patterning process, and the first power signal line pattern 40, the second power signal line pattern and the first source-drain metal layer in the sub-pixel driver circuit are simultaneously formed through a single patterning process, thereby simplifying the manufacturing procedure of the display substrate and reducing the manufacturing cost of the display substrate.

It should be noted that the various embodiments described herein are described in a progressive manner, the same or similar parts among the various embodiments can be referred to each other, with each embodiment focusing on the difference from the other embodiments. In particular, the method embodiments are described in a simply way because they are substantially similar to the product embodiments, and the released parts can refer to the description of the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "include" or "comprise", and the like, means that the presence of an element or item preceding the word encompasses the presence of the element or item listed after the word and equivalents thereof, but does not exclude other elements or items. The terms "connect", "couple" or "link" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

The foregoing only describes specific embodiments of the present disclosure, but the protection scope of the present disclosure is not limited thereto. Any changes and substitutions that would be readily conceived by those skilled in the art with the teaching of the present disclosure fall within the protection scope of the present disclosure. Therefore, the protection scope of the present disclosure is set forth in the appended claims.

What is claimed is:

1. A display substrate, comprising: a display area and a non-display area surrounding the display area; the display substrate further comprising a cathode, a first power signal line pattern and at least one driver chip;
    wherein at least a portion of the cathode is located in the display area;
    the at least one driver chip is located in the non-display area; and
    the first power signal line pattern is located in the non-display area and is located on at least one side of the display area, and the first power signal line pattern comprises a first transmission portion and a first incoming line portion electrically connected to the first transmission portion; and the first transmission portion extends in a first direction, the first transmission portion is electrically connected to the cathode, the first incoming line portion extends in a second direction intersecting with the first direction, and the first incoming line portion is electrically connected to the at least one driver chip;
    wherein the display substrate further comprises a second power signal line pattern, and the second power signal line pattern comprises a first sub-pattern and a plurality of second sub-patterns;
    the first sub-pattern comprises a second transmission portion, and two second incoming line portions electrically connected to the second transmission portion, the two second incoming line portions are electrically connected to the at least one driver chip, and the first power signal line pattern is located between the two second incoming line portions;
    the plurality of second sub-patterns is located in the display area, and the plurality of second sub-patterns is electrically connected to the second transmission portion; and the second power signal line pattern is configured to transmit a positive power signal.

2. The display substrate according to claim 1, wherein the at least one driver chip is located at a first side of the display area, and the first power signal line pattern is located between the display area and the at least one driver chip; and the first power signal line pattern is configured to transmit a negative power signal.

3. The display substrate according to claim 1, wherein the display area comprises a plurality of data lines and a plurality of sub-pixels, and the plurality of data lines is electrically connected to the plurality of sub-pixels; the non-display area comprises a fan-out region and a driver chip bonding region, wherein the fan-out region is located between the display area and the driver chip bonding region;
    the fan-out region comprises a plurality of fan-out lines, at least one of the fan-out lines is an integral structure, and first ends of the plurality of fan-out lines are connected to the plurality of data lines; and
    the at least one driver chip is arranged in the driver chip bonding region, and second ends of the plurality of fan-out lines are connected to first pins included in the at least one driver chip.

4. The display substrate according to claim 3, wherein the plurality of fan-out lines is arranged in the same layer and made of the same material.

5. The display substrate according to claim 3, wherein the plurality of fan-out lines comprise a plurality of first fan-out lines and a plurality of second fan-out lines, the plurality of first fan-out lines is arranged in the same layer and made of the same material, and the plurality of second fan-out lines is arranged in the same layer and made of the same material; the plurality of first fan-out lines and the plurality of second fan-out lines are arranged in different layers; and orthographic projections of the plurality of first fan-out lines onto a base of the display substrate and orthographic projections of the plurality of second fan-out lines onto the base are alternately arranged.

6. The display substrate according to claim 3, wherein the fan-out region and the driver chip bonding region are both located at a first side of the display area; and
    the non-display area is provided with an electrostatic discharge circuit, and the electrostatic discharge circuit is located at a second side of the display area, the first side is opposite to the second side.

7. The display substrate according to claim 3, wherein the first power signal line pattern and the second power signal line pattern are arranged in the same layer, and the first power signal line pattern is insulated from the second power signal line pattern.

8. The display substrate according to claim 7, wherein the display substrate further comprises an insulating layer, and in a direction perpendicular to the base of the display substrate, the first power signal line pattern and the second power signal line pattern are located at the same side of the insulating layer, and the plurality of fan-out lines is located at the other side of the insulating layer; and
    an orthographic projection of the first power signal line pattern onto the base of the display substrate at least partially overlaps with orthographic projections of the plurality of fan-out lines onto the base; and/or an orthographic projection of the second power signal line pattern onto the base at least partially overlaps with the orthographic projections of the plurality of fan-out lines onto the base.

9. The display substrate according to claim 7, wherein the orthographic projection of the first power signal line pattern onto the base of the display substrate does not overlap with the orthographic projections of the plurality of fan-out lines onto the base.

10. The display substrate according to claim 3, wherein the display substrate further comprises a sub-pixel driver circuit, the sub-pixel driver circuit comprises:
   an active layer, a first gate metal layer and a first source-drain metal layer which are stacked in the sequence listed in a direction away from the base of the display substrate; and
   the plurality of fan-out lines and the first source-drain metal layer are arranged in the same layer and made of the same material, and the first power signal line pattern and the second power signal line pattern are both arranged in the same layer and made of the same material as the first gate metal layer.

11. The display substrate according to claim 3, wherein the display substrate further comprises a sub-pixel driver circuit, the sub-pixel driver circuit comprises:
   an active layer, a first gate metal layer and a first source-drain metal layer which are stacked in the sequence listed in a direction away from the base of the display substrate; and
   the plurality of fan-out lines and the first gate metal layer are arranged in the same layer and made of the same material, and the first power signal line pattern and the second power signal line pattern are both arranged in the same layer and made of the same material as the first source-drain metal layer.

12. The display substrate according to claim 3, wherein the plurality of fan-out lines is grouped into at least one fan-out line set which is in one-to-one correspondence with the at least one driver chip, a fan-out line set in the at least one fan-out line set is of a fan shape, and second ends of fan-out lines included in the fan-out line set are connected to first pins included in a corresponding driver chip in one-to-one correspondence.

13. A display device, comprising a display substrate, wherein the display substrate comprises a display area and a non-display area surrounding the display area; the display substrate further comprises a cathode, a first power signal line pattern and at least one driver chip;
   wherein at least a portion of the cathode is located in the display area;
   the at least one driver chip is located in the non-display area; and
   the first power signal line pattern is located in the non-display area and is located on at least one side of the display area, and the first power signal line pattern comprises a first transmission portion and a first incoming line portion electrically connected to the first transmission portion; and the first transmission portion extends in a first direction, the first transmission portion is electrically connected to the cathode, the first incoming line portion extends in a second direction intersecting with the first direction, and the first incoming line portion is electrically connected to the at least one driver chip;
   wherein the display substrate further comprises a second power signal line pattern, and the second power signal line pattern comprises a first sub-pattern and a plurality of second sub-patterns;
   the first sub-pattern comprises a second transmission portion, and two second incoming line portions electrically connected to the second transmission portion, the two second incoming line portions are electrically connected to the at least one driver chip, and the first power signal line pattern is located between the two second incoming line portions;
   the plurality of second sub-patterns is located in the display area, and the plurality of second sub-patterns is electrically connected to the second transmission portion; and
   the second power signal line pattern is configured to transmit a positive power signal.

14. The display device according to claim 13, wherein the at least one driver chip is located at a first side of the display area, and the first power signal line pattern is located between the display area and the at least one driver chip; and the first power signal line pattern is configured to transmit a negative power signal.

15. The display device according to claim 13, wherein the display area comprises a plurality of data lines and a plurality of sub-pixels, and the plurality of data lines is electrically connected to the plurality of sub-pixels; the non-display area comprises a fan-out region and a driver chip bonding region, wherein the fan-out region is located between the display area and the driver chip bonding region;
   the fan-out region comprises a plurality of fan-out lines, at least one of the fan-out lines is an integral structure, and first ends of the plurality of fan-out lines are connected to the plurality of data lines; and
   the at least one driver chip is arranged in the driver chip bonding region, and second ends of the plurality of fan-out lines are connected to first pins included in the at least one driver chip.

16. The display device according to claim 15, wherein the plurality of fan-out lines comprise a plurality of first fan-out lines and a plurality of second fan-out lines, the plurality of first fan-out lines is arranged in the same layer and made of the same material, and the plurality of second fan-out lines is arranged in the same layer and made of the same material; the plurality of first fan-out lines and the plurality of second fan-out lines are arranged in different layers; and orthographic projections of the plurality of first fan-out lines onto a base of the display substrate and orthographic projections of the plurality of second fan-out lines onto the base are alternately arranged.

17. The display device according to claim 15, wherein the display substrate further comprises a sub-pixel driver circuit, the sub-pixel driver circuit comprises:
   an active layer, a first gate metal layer and a first source-drain metal layer which are stacked in the sequence listed in a direction away from the base of the display substrate; and
   the plurality of fan-out lines and the first source-drain metal layer are arranged in the same layer and made of the same material, and the first power signal line pattern and the second power signal line pattern are both arranged in the same layer and made of the same material as the first gate metal layer.

18. The display device according to claim 15, wherein the display substrate further comprises a sub-pixel driver circuit, the sub-pixel driver circuit comprises:
   an active layer, a first gate metal layer and a first source-drain metal layer which are stacked in the sequence listed in a direction away from the base of the display substrate; and
   the plurality of fan-out lines and the first gate metal layer are arranged in the same layer and made of the same material, and the first power signal line pattern and the second power signal line pattern are both arranged in the same layer and made of the same material as the first source-drain metal layer.

\* \* \* \* \*